(12) United States Patent
Buynoski et al.

(10) Patent No.: US 6,279,147 B1
(45) Date of Patent: Aug. 21, 2001

(54) USE OF AN EXISTING PRODUCT MAP AS A BACKGROUND FOR MAKING TEST MASKS

(75) Inventors: Matthew S. Buynoski, Palo Alto; Ramkumar Subramanian; Todd Lukanc, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/540,365

(22) Filed: Mar. 31, 2000

(51) Int. Cl.⁷ .............................. G03F 9/00; H01L 21/66
(52) U.S. Cl. .................... 716/19; 438/16; 430/5
(58) Field of Search ............. 430/4, 5, 30; 716/2, 716/4, 5, 19; 438/16

(56) References Cited

U.S. PATENT DOCUMENTS

| | | | |
|---|---|---|---|
| 5,300,786 | * | 4/1994 | Brunner et al. . |
| 5,439,764 | * | 8/1995 | Alter et al. . |
| 5,681,674 | | 10/1997 | Fujimoto . |
| 5,721,074 | | 2/1998 | Bae . |
| 5,784,292 | | 7/1998 | Kumar . |
| 5,790,254 | * | 8/1998 | Ausschnitt . |
| 5,910,847 | * | 6/1999 | Van der Werf et al. . |

FOREIGN PATENT DOCUMENTS

| | | | |
|---|---|---|---|
| 54-102972 | * | 8/1979 | (JP) . |
| 62-102528-A | * | 5/1987 | (JP) . |
| 1145735-A | * | 6/1989 | (JP) . |
| 5333526-A | * | 12/1993 | (JP) . |

OTHER PUBLICATIONS

IBM Technical Disclosure Bulletin, "Exposure Mask Diagnostic and Dispersion Targets", Mar. 1980, vol. 22, Issue No. 10, pp. 4505–4507.*

* cited by examiner

Primary Examiner—Chandra Chaudhari
Assistant Examiner—Evan Pert
(74) Attorney, Agent, or Firm—Amin & Turocy, LLP

(57) ABSTRACT

One aspect of the present invention relates to a method of making a test mask, involving the steps of providing an existing product mask pattern having a first pattern thereon; removing a portion of the first pattern from the existing product mask pattern; and forming a test pattern in the portion of the existing product mask pattern to provide the test mask, wherein the first pattern of the existing product mask pattern is substantially similar in at least one of pattern density, pattern variability, pattern size, pattern shape, preferential direction, and pattern scribe with the test pattern. Another aspect of the present invention relates to a test mask, containing a wall paper portion comprising a first pattern from an existing product mask pattern; and a test portion comprising a test pattern, wherein the first pattern of the existing product mask pattern is substantially similar in at least one of pattern density, pattern variability, pattern size, pattern shape, preferential direction, and pattern scribe with the test pattern.

25 Claims, 7 Drawing Sheets

USE OF AN EXISTING PRODUCT MAP AS A BACKGROUND FOR MAKING TEST MASKS

TECHNICAL FIELD

The present invention generally relates to improved semiconductor processing via improved test masks. In particular, the present invention relates to making and using improved lithography/etch/implantation test masks that contain existing product maps.

BACKGROUND ART

Microlithography processes for making miniaturized electronic components, such as in the fabrication of computer chips and integrated circuits, are of increasing importance as the trend towards miniaturization and integration continues. Lithography is one of the key technologies that drives the growth of the integrated circuit industry. Other important semiconductor processes include etch processes and implantation processes. These processes are building tools for fabricating integrated circuit chips.

Lithography processes, etch processes and implantation processes involve the use of masks. Masks contain patterns of translucent/transmissive areas and opaque/blocking areas. Masks function by selectively preventing or blocking a substance, such as light, electron beams, ions, etchants, etc., from portions of a subject substrate while permitting the substance to contact other portions of the subject substrate. In these semiconductor mask processes, improved masks and improved mask processing are desired since they would lead to improved products.

Lithography masks are employed to selectively irradiate a resist covered semiconductor substrate. Etch masks are used to selectively remove exposed areas of an underlying substrate. Ion implantation masks are used to selectively implant ions in exposed areas of an underlying substrate. Such masks are a critical aspect of semiconductor processing and lithographic processing in particular because they play an important role in achieving ever decreasing pattern specifications. Important factors associated with making and using masks include pattern position accuracy, feature size control, and defect density. Masks, whether they are lithography masks or etch masks or ion implantation masks, are made in compliance with a desired design rule (the design rule is derived from numerous aspects of the process).

Prior to using product masks in semiconductor processing (hereinafter termed using a "product mask"), a so-called "test mask" is fabricated to confirm and optimize the operability of a prospective mask design and technology, such as the relationships between patterning, etching, implants, and the like. In other words, test masks permit one to evaluate the technology (such as the acceptability of patterning, etching, and the like) of a prospective mask design. One concern associated with making and using masks, whether the mask is a product mask or a test mask, is that fabrication is complex and costly. Referring to FIG. 1, a conventional test mask 10 is shown. A conventional test mask 10 has test patterns 12 over a substrate. The test patterns 12 define various slits or openings 14 in the mask. The test mask 10 is used to determine whether or not the test patterns 12 lead to the production of desired patterned structures (in the case of a lithography test mask).

Another concern regarding masks is that a product mask derived from a corresponding test mask behaves in a different manner. These differences deleteriously impact subsequent semiconductor processing. For example, differences between a product mask and a corresponding test mask may lead to undesirable changes in resist images. During the image-wise irradiation, dense fields may change the amount of light (intensity) passing through the mask. During development, unanticipated concentrations of development components in localized areas affect the size and shape (such as sidewall slope) of openings. This is especially troublesome as resists having a poor slope undesirably permit implants to reach the underlying substrate.

Generally speaking, a lithography product mask that provides a patterned resist which does not accurately reflect the pattern formed by the test mask requires additional engineering and study in order to further refine/compensate the product mask, otherwise the electrical characteristics of semiconductor devices made therewith are unreliable. Such refinement undesirably consumes time and money. It is therefore desirable to provide product masks that act in the same manner as their corresponding test masks.

SUMMARY OF THE INVENTION

The present invention provides an improved semiconductor processing including improved lithographic processing, improved etch processing and improved implantation processing. The present invention specifically provides test masks and methods of making and using test masks useful in lithographic processing, etch processing, implantation processing, and other processing steps. Semiconductor mask processing is improved because the test masks of the present invention behave in substantially the same manner as product masks derived therefrom. As a result, expensive, complex and time consuming efforts to re-engineer product masks that behave differently from their corresponding test masks are minimized and/or eliminated.

One aspect of the present invention relates to a method of making a test mask, involving the steps of providing an existing product mask pattern having a first pattern; removing a portion of the first pattern from the existing product mask; and forming a test pattern in the portion of the existing product mask pattern to provide the test mask, wherein the first pattern of the existing product mask pattern is substantially similar in at least one of pattern density, pattern variability, pattern size, pattern shape, preferential direction, and pattern scribe with the test pattern.

Another aspect of the present invention relates to a method of making a test mask, involving the steps of forming a test pattern in a portion of a mask; and providing an existing product mask pattern having a first pattern in another portion of the mask to provide the test mask, wherein the first pattern of the existing product mask is substantially similar in at least one of pattern density, pattern variability, pattern size, pattern shape, preferential direction, and pattern scribe with the test pattern.

Yet another aspect of the present invention relates to a test mask, containing a wall paper portion comprising a first pattern from an existing product mask pattern; and a test portion comprising a test pattern, wherein the first pattern of the existing product mask pattern is substantially similar in at least one of pattern density, pattern variability, pattern size, pattern shape, preferential direction, and pattern scribe with the test pattern.

Still yet another aspect of the present invention relates to a method of using a test mask involving the steps of providing the test mask comprising a wall paper portion comprising a first pattern from an existing product mask pattern and a test portion comprising a test pattern, wherein the first pattern of the existing product mask pattern is substantially similar in at least one of pattern density, pattern variability, pattern size, pattern shape, preferential direction, and pattern scribe with the test pattern; using the test mask in a semiconductor process with a subject substrate; and evaluating the subject substrate.

DISCLOSURE OF INVENTION

Figure 1:
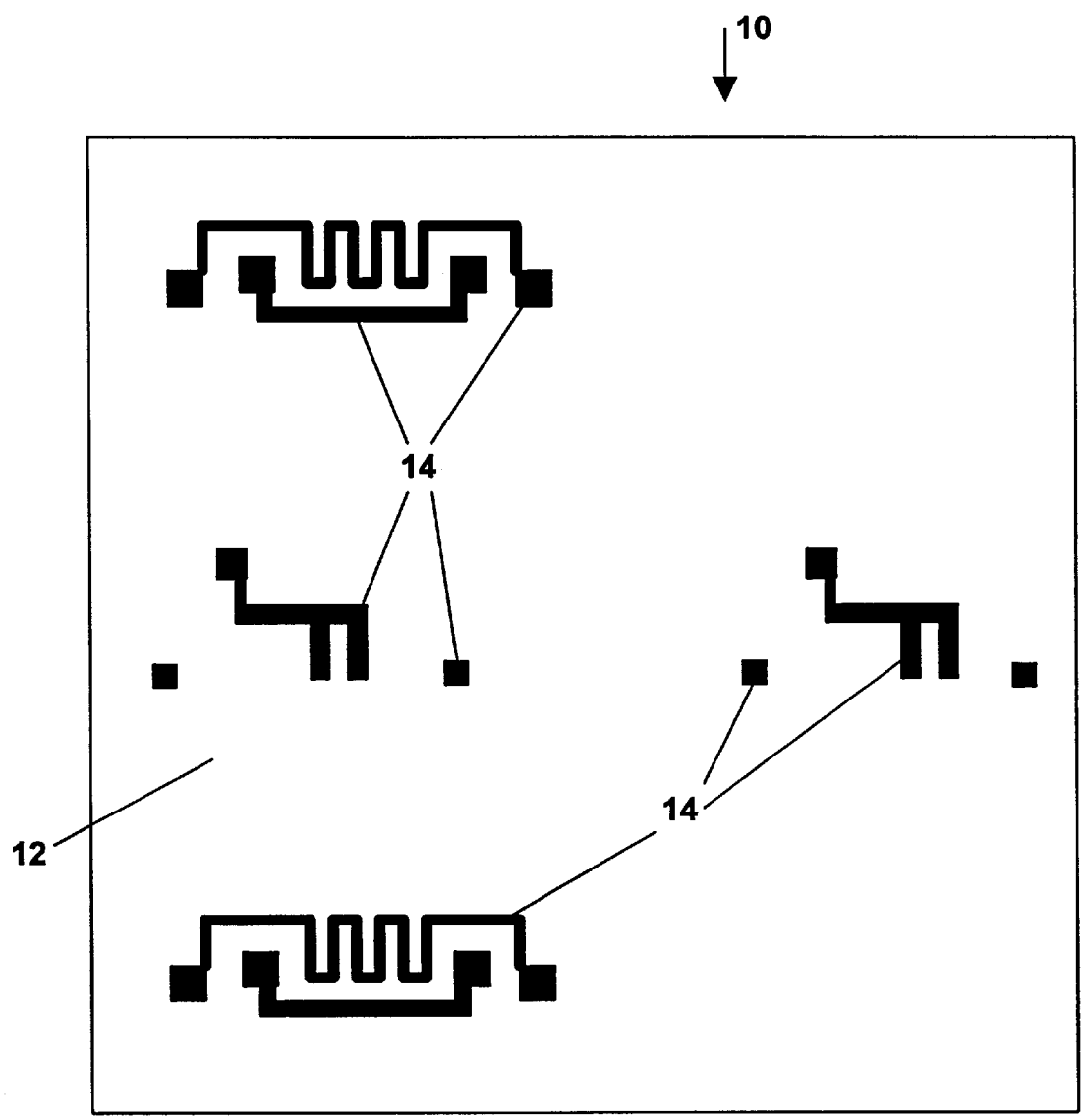
FIG. 1 illustrates a plan view of a prior art test mask.

The present invention involves improving the processing of a mask by making a test mask that functions in substantially the same manner as the corresponding product mask. The present invention more specifically involves making a test mask from an existing product mask data pattern which, in turn, effectively reproduces the conditions encountered when subsequently using the corresponding product mask. This reproduction of conditions substantially decreases the additional engineering and evaluation required to refine/ compensate the product mask since the test mask and the product mask behave in at least substantially the same manner.

Various aspects of the product mask that impact processing parameters are mimicked in the test mask, thereby providing a test mask that behaves like a product mask. For example, in development or etch processes, substantially the same amount of chemistry occurs during use of the test mask and the product mask as a result of the present invention. Conventionally in development or etch processes, a larger amount of chemistry occurs when using a product mask compared to a corresponding test mask. Also as a result of the present invention, during polishing substantially the same polishing rate is achieved since the pattern density, pattern variability, and pattern size are substantially the same for the test mask and the product mask. Otherwise, a polishing process may undesirably overpolish or underpolish certain features of a semiconductor substrate.

A test mask of the present invention is made by providing an existing product mask pattern. An existing product mask pattern is a mask previously used in semiconductor processing (or intended for use in semiconductor processing), such as lithography processing, etch processing, and/or implantation processing. The existing product mask pattern typically is in the form of computer readable data. However, the existing product mask pattern may be in the form of an existing product mask, from which the pattern may be obtained.

A specific existing product mask pattern is selected for use in accordance with the present invention based upon similarity with the test pattern in at least one of a number of factors. These factors include pattern density, pattern periodicity or variability, pattern size, pattern shape, preferential direction, and pattern scribe. In preferred embodiments, the existing product mask pattern is selected based upon at least two of the factors, and more preferably at least three of the factors, and even more preferably at four of the factors. "Similar" does not mean the same, but instead means that a given factor has a roughly equivalent impact on mask processing (a minor difference in degree versus difference in kind).

In one embodiment, the existing product mask pattern employed has a similar pattern density as the test mask made in accordance with the present invention. Existing product mask patterns having either a relatively a high pattern density, a medium pattern density, or a relatively low pattern density are alternatively employed as dictated by the density of the test pattern (described later) of the subsequently formed test mask.

Mask pattern density, for purposes of this invention, means the ratio of translucent pattern surface area to opaque pattern surface area in a given pattern. In one embodiment, the pattern density of the existing product mask pattern is similar to the pattern density of the test pattern in that it is within about 75% (either 75% higher or 75% lower) of the pattern density of the test pattern (described in detail later). In another embodiment, the pattern density on the existing product mask pattern is within about 50% of the pattern density of the test pattern. In yet another embodiment, the pattern density of the pattern on the existing product mask pattern is within about 25% of the pattern density of the test pattern.

In another embodiment, the existing product mask pattern employed has a similar pattern periodicity or variability as the test mask made in accordance with the present invention. Existing product mask patterns having high degrees of variability are employed with test patterns having a high degree of variability whereas existing product mask patterns having low degrees of variability are employed with test patterns having a low degree of variability.

Mask pattern variability, for purposes of this invention, refers to the nature of the pattern. For example, mask patterns tend to be random (containing non-repetitive features), predictable (containing repeating features), or a combination of random and predictable. Random mask patterns are frequently found in the fabrication of logic circuits while predictable mask patterns are frequently found in the fabrication of large array type circuits such as SRAM circuits, DRAM circuits and flash memory circuits.

In yet another embodiment, the existing product mask pattern employed has a similar pattern size as the test mask made in accordance with the present invention. Existing product mask patterns having large pattern features are employed with test patterns having large pattern features while existing product mask patterns having small pattern features are employed with test patterns having small pattern features. Similarly, existing product mask patterns having a first amount of large pattern features and a second amount of small pattern features are employed with test patterns having about the first amount of large pattern features and about the second amount of small pattern features.

Mask pattern size, for purposes of this invention, refers to the size of the open or translucent areas of a mask, and particularly to the average size of the open areas of a mask. While pattern density is concerned with the total surface area of the open areas of a mask, pattern size is concerned with the average area of individual open areas of a mask. In one embodiment, the average size of the open areas of an existing product mask pattern is similar to a test mask in that it is within about 75% (larger or smaller) of the average size of the open areas of the test mask. In another embodiment, the average size of the open areas of an existing product mask pattern is similar to a test mask in that it is within about 50% (larger or smaller) of the average size of the open areas of the test mask.

In still yet another embodiment, the existing product mask pattern employed has a similar pattern shape. Existing product mask patterns having primarily square or rectangular pattern features are employed with test patterns having primarily square or rectangular pattern features while existing product mask patterns having primarily line pattern features are employed with test patterns having primarily line pattern features. It is understood that most masks contain features having a number of different shapes. But in some masks, one, two, three or even more types of shapes tend to predominate. Alternatively existing product mask patterns having a certain amount of each of different types of shapes are employed with test patterns having roughly substantially the same amounts of similar or related shapes.

Mask pattern shape, for purposes of this invention, refers to the shapes of the features of a mask. For example, mask shapes include circles, squares, rectangles, lines, triangular features, L-shaped features, cross shaped features, hexagons, semicircles, and numerous other geometrical shapes, any combination of two or more thereof, and linear connections between two or more such shapes.

In still another embodiment, the existing product mask pattern employed has a similar preferential direction. Existing product mask patterns having preferential direction in the x direction are employed with test masks preferential direction in the x direction. Similarly, existing product mask patterns having preferential direction in the y direction are employed with test masks preferential direction in the y direction. And existing product mask patterns having little or no preferential direction are employed with test masks having little or no preferential direction.

Mask preferential direction, for purposes of this invention, refers to the general direction of the features of the mask. In this connection, square features, circular features and cross shaped features do not have a preferential direction as they extend equally in the x and y directions. However, a rectangle and a line extend further in one of the x or y direction than the other of the x or y direction. Circuit patterns tend to show a strong or weak preferential direction in either the x or y direction (which ever direction the lines are oriented).

In another embodiment, the existing product mask pattern employed has a similar pattern scribe with the test mask. Existing product mask patterns having large structures with small die are employed with test masks having large structures with small die. Existing product mask patterns having small structures with large die are employed with test masks having small structures with large die. Mask pattern scribe, for purposes of this invention, refers to the area between product die.

When selecting an existing product mask pattern for a test mask, it is understood that an existing product mask pattern typically does not have the exact same pattern density, pattern periodicity or variability, pattern size, pattern shape, preferential direction, and pattern scribe as the test mask. Maximizing similarity between at least one of the pattern density, pattern periodicity or variability, pattern size, pattern shape, preferential direction, and pattern scribe of an existing product mask pattern and a test mask is desired.

There are at least two general sequences of steps employed to make the test mask of the present invention. One general sequence involves starting with an existing product mask pattern, removing portions of the pattern, and inserting the test pattern in the removed portions (see FIGS. 2–4). Another general sequence involves starting by inserting the test pattern on a blank mask, and filling in the remaining portions with an existing product mask pattern (see FIGS. 6 and 7).

A portion of the existing product mask pattern is filled in the areas outside of the test pattern. Alternatively, a portion of the existing product mask pattern is removed and replaced with a test pattern. The size of the portion of the existing product mask pattern filled in or removed is not critical to the present invention, but it is of suitable size to accommodate the test pattern. In one embodiment, the size of the filled in or removed portion is from about 1% to about 90% of the surface area of the mask surface. In another embodiment, the size of the filled in or removed portion is from about 3% to about 70% of the surface area of the mask surface. In yet another embodiment, the size of the filled in or removed portion is from about 5% to about 50% of the surface area of the mask surface. Additionally, two or more portions of the existing product mask pattern may be removed and replaced with a test pattern.

A test substrate at least substantially equal in size to the portion removed from the existing product mask is positioned in the hole replacing the removed portion. The test substrate contains a test pattern and is preferably made of the same materials that constitute the existing product mask. Alternatively, the test substrate may be made of materials different from the existing product mask, such as a different light blocking material. The test substrate is integrated into the existing product mask by any suitable means. For example, the wall paper portions on the existing product mask are covered with a resist and the substrate of the existing product mask is exposed, and a test pattern is formed on the substrate in the exposed portion of the existing product mask.

Methods of designing the test patterns that are formed in the test substrates are known. Generally, test patterns are developed using computer assisted design equipment while considering the identity of the materials employed, the processing parameters, and applicable design rules.

Conventional test mask patterns have a surface area in which a small amount, such as less than 1% (by area), is patterned. The test mask made in accordance with the present invention, in one embodiment, has a surface area in which more than about 20% is patterned including both the test pattern and the pattern from the existing product mask pattern. In another embodiment, the test mask made in accordance with the present invention has a surface area in which more than about 25% is patterned. In yet another embodiment, the test mask made in accordance with the present invention has a surface area in which more than about 30% is patterned.

In some instances after the selected portion of the product pattern is filled in around the test pattern or removed from the existing product mask pattern, unwanted material may remain in the selected portion and/or the cut may traverse portions of the product pattern. Unwanted material and/or cuts through an existing pattern may undesirably lead to defects and/or stubs in the subsequently formed test mask. A design rule check is performed on the wall paper area adjacent the hole or product pattern. The design rule check enables one to identify and remove any features that are smaller than the technology permits. Removing unwanted small features that may cause defects and/or stubs from an area just outside the product area makes the hole a clean hole.

The test mask containing a test portion and a wall paper portion is employed to evaluate a proposed mask pattern. The mask pattern may be subsequently employed in semiconductor processing, including lithography processing, etch processing, implantation processing, and chemical mechanical polishing processing, as well as other processes. Evaluating a proposed mask pattern involves customizing the test portion with the proposed pattern and then using the test mask in conjunction with a subject substrate in a lithography process, etch process and/or implantation process. The subject substrate is then inspected, examined and evaluated to determine the efficacy of the lithography, etch and/or implantation process.

Once a lithography, etch and/or implantation process is optimized with a test mask made in accordance with the present invention, a product mask is made based on the pattern in the test portion of the test mask. A product mask derived from a test mask made in accordance with the present invention behaves in substantially the same manner as the test mask, thereby minimizing the necessity to compensate the product mask when it behaves differently from the test mask. While not wishing to be bound by any theory, it is believed that the wall paper portion of the test mask of the present invention reproduces the conditions encountered when using a product mask (such as making the density of the test mask approximately the same as any product mask).

Referring to the Figures, various specific aspects of the present invention are hereinafter described. In the Figures, like numerals refer to like features. One embodiment of making a test mask is described in FIGS. 2–4 while another embodiment of making a test mask is described in FIGS. 6 and 7.

Figure 2:
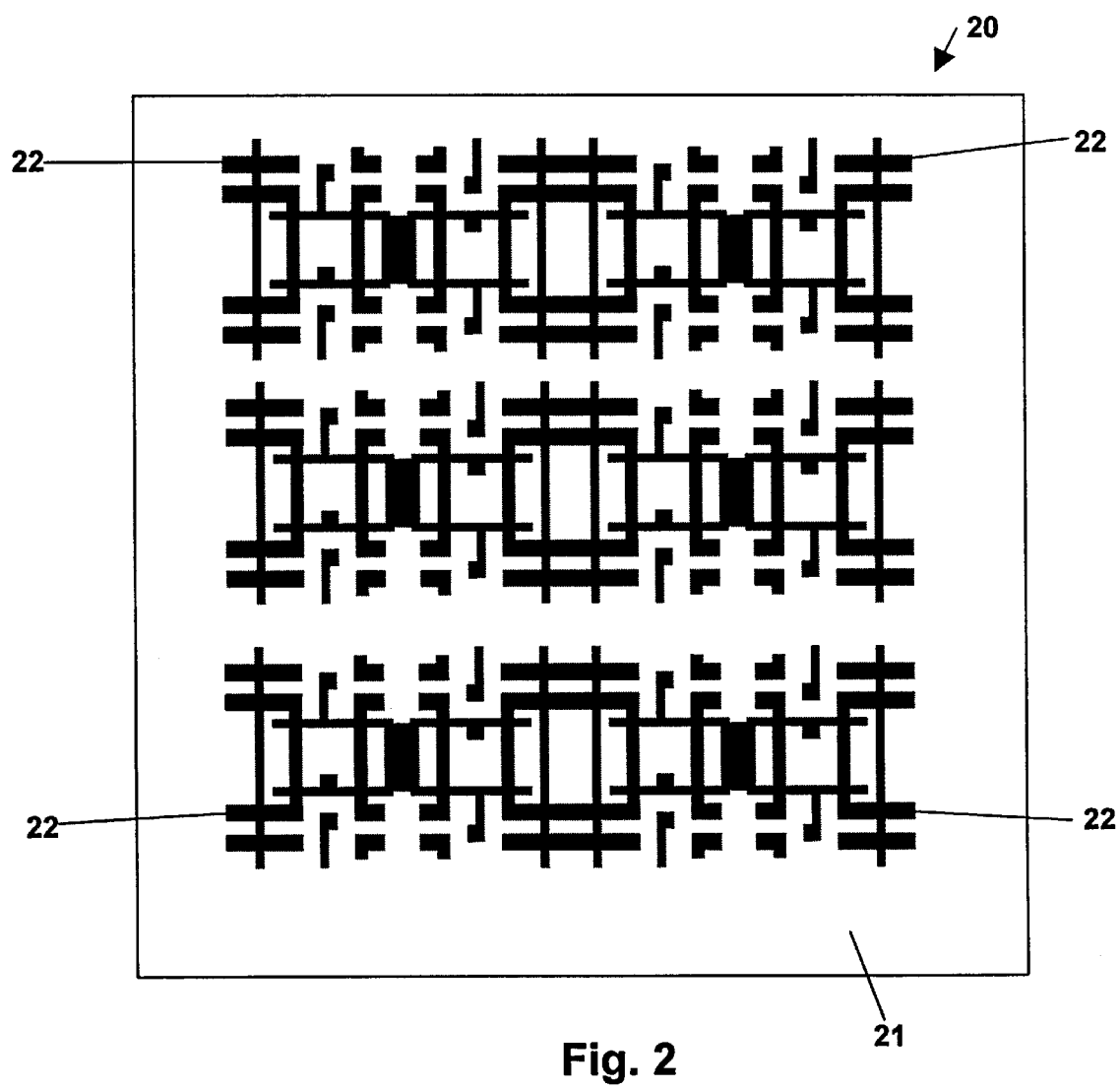
FIG. 2 illustrates a plan view of an existing product mask useful for making a test mask according to one aspect of the present invention.

Referring to FIG. 2, an existing product mask pattern 20 is provided. The existing product mask pattern 20 contains opaque regions 21 and patterned transparent regions or openings 22. In the patterned opaque regions 21/openings 22, the pattern density is about 20% to about 30%, the pattern variability is relatively small, pattern shape comprised of rectangles and lines, the preferential direction small, but slightly in the x-direction (horizontal).

Figure 3:
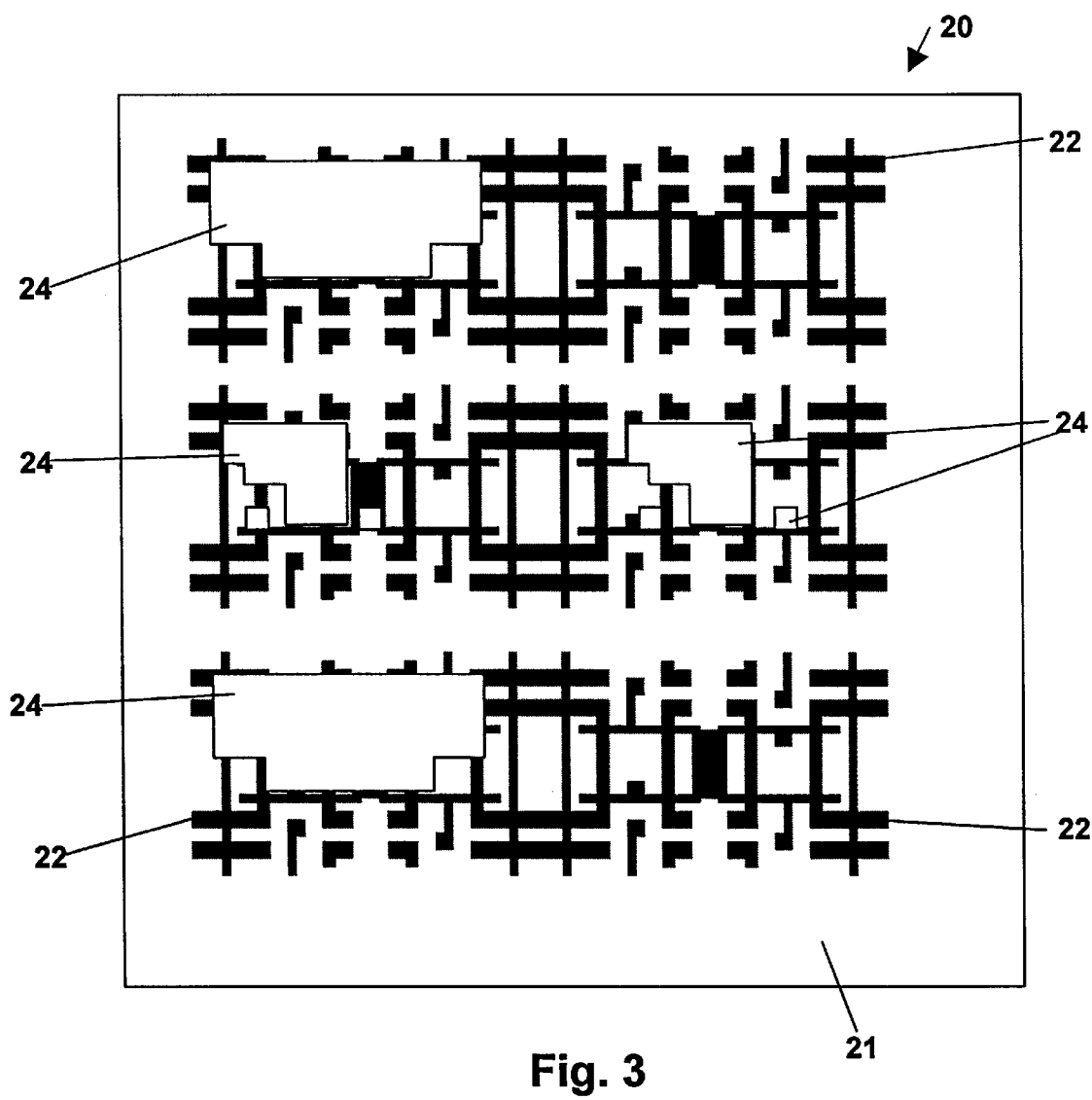
FIG. 3 illustrates a plan view of a modified existing product mask useful for making a test mask according to one aspect of the present invention.

Referring to FIG. 3, portions 24 of the existing product mask pattern 20 are removed. Remaining on the existing product mask 20 are remaining portions of the opaque regions 21 and the patterned transparent regions 22. The portion of the existing product mask pattern 20 outside of the holes 24 cut therein, constitutes the wall paper of the subsequently formed test mask (see FIG. 4).

Figure 4:
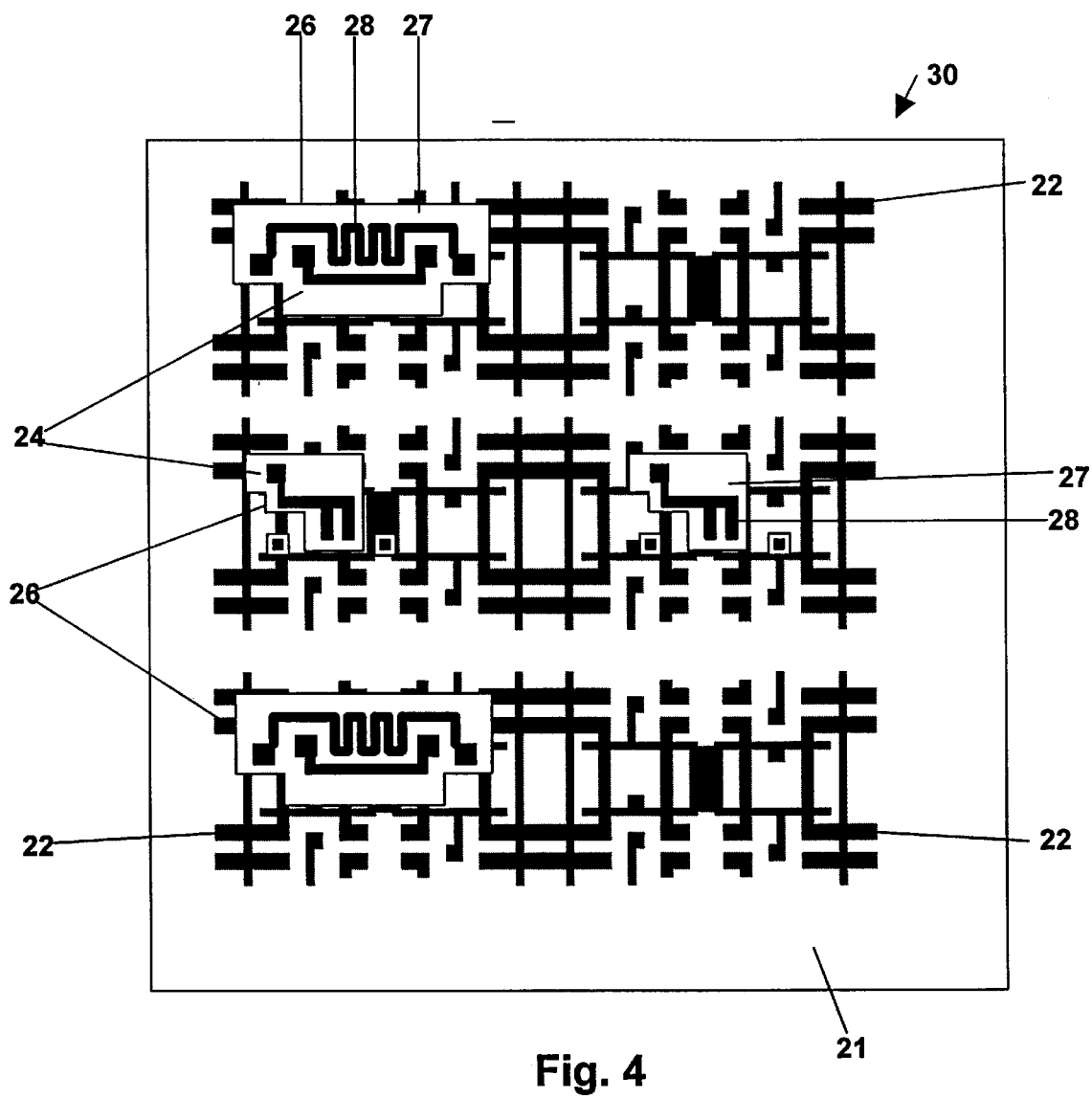
FIG. 4 illustrates a plan view of a test mask according to one aspect of the present invention.

Referring to FIG. 4, test substrates 26 are positioned in the holes 24 cut in the existing product mask pattern 20 to provide a test mask 30 according to the present invention. The test substrates 26 are made of opaque regions 27 and patterned transparent regions or openings 28. In the patterned opaque regions 27 openings 28, the pattern density is about 20% to about 30%, the pattern variability is relatively small, pattern shape comprised of rectangles, squares and lines, the preferential direction medium to small, in the x-direction (horizontal). The test mask 30 contains two portions; namely, a test portion represented by the test substrates 26 and a wall paper portion represented by the remaining portion of the existing product mask pattern 20 outside of the holes 24 cut therein. Thus, the test mask contains a test portion having at least one test pattern and a wall paper portion having an existing product mask pattern.

Figure 5:
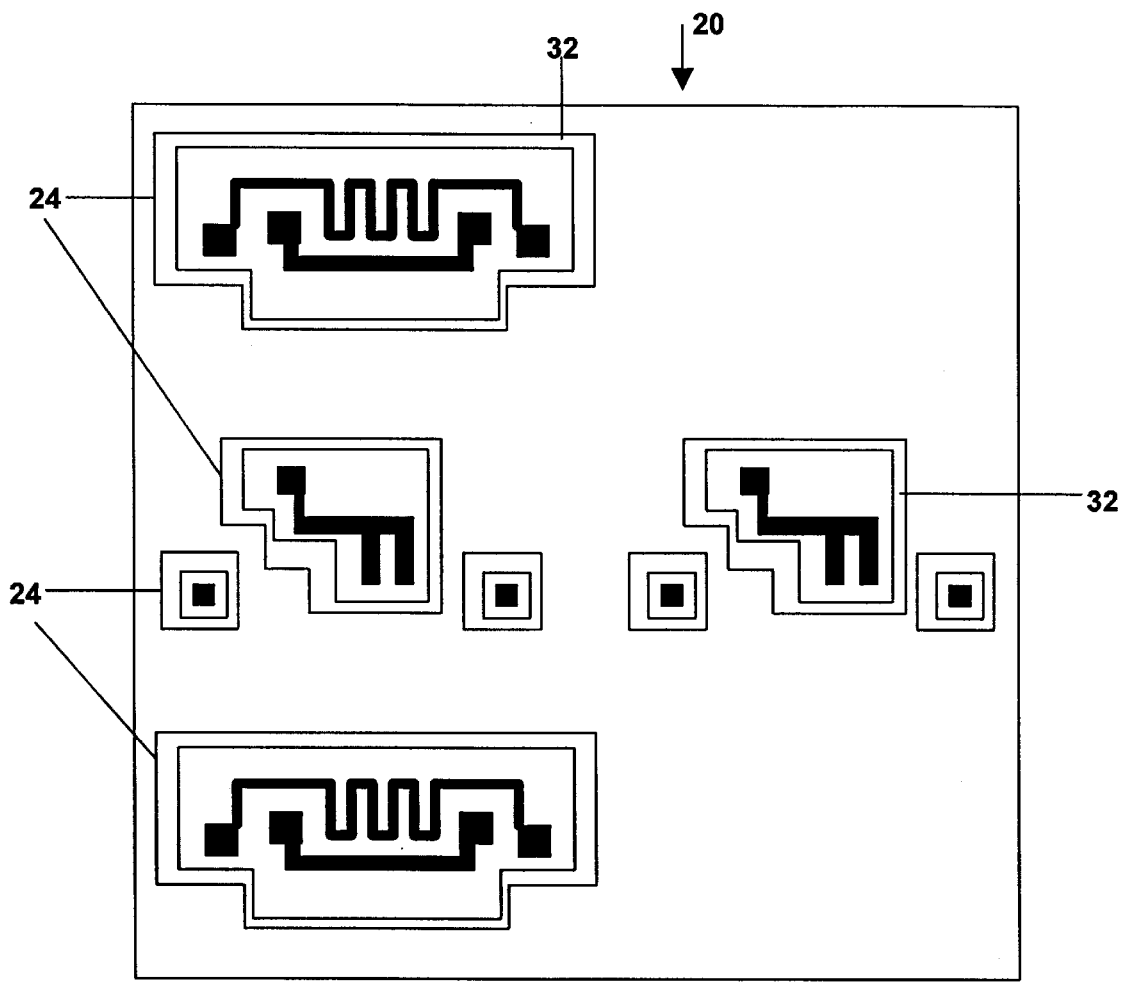
FIG. 5 illustrates a plan view of a modified existing product mask useful for making a test mask according to one aspect of the present invention.

Referring to FIG. 5, an optional aspect of the present invention addressing the formation of defects and/or stubs in the subsequently formed test mask is described. The existing product mask pattern 20 of FIG. 5 essentially corresponds to the existing product mask pattern 20 of FIG. 3, except the wall paper portion is not shown for simplicity. A design rule check is performed on an area 32 adjacent the holes 24. The design rule check enables one to identify and remove any features that are smaller than the technology permits. Removing unwanted small features that may cause defects and/or stubs from an area just outside the hole makes the hole a clean hole.

Figure 6:
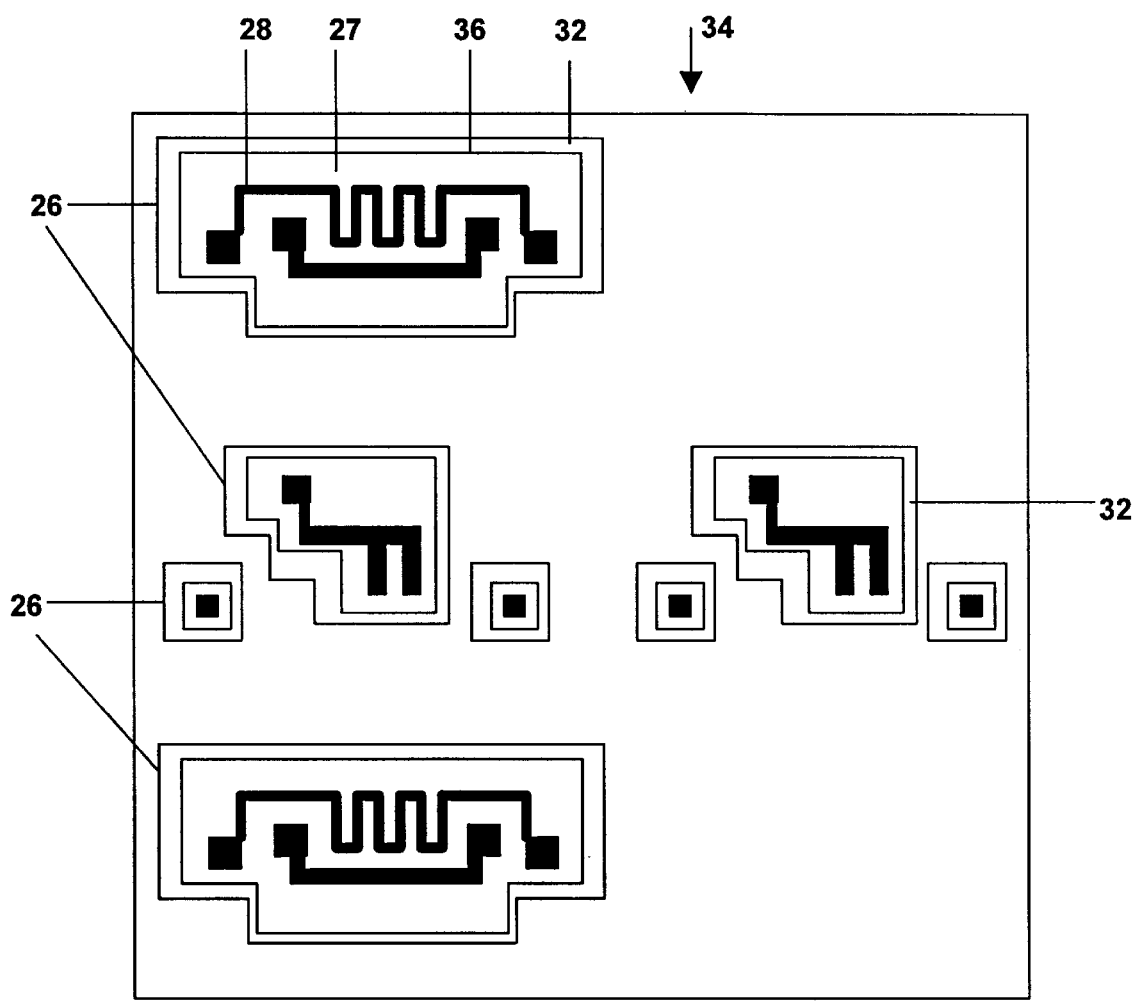
FIG. 6 illustrates a plan view of a mask useful for making a test mask according to one aspect of the present invention.

Referring to FIG. 6, test substrates 26 are positioned on a blank mask 34. The test substrates 26 contain test patterns 36 which in turn contain opaque regions 27 and patterned transparent regions or openings 28. The test substrates 26 further contain area 32. A design rule check is subsequently performed on an area 32 after the test mask is completed. The design rule check enables one to identify and remove any features that are smaller than the technology permits. As a result, the formation of defects and/or stubs in the subsequently formed test mask is addressed.

Figure 7:
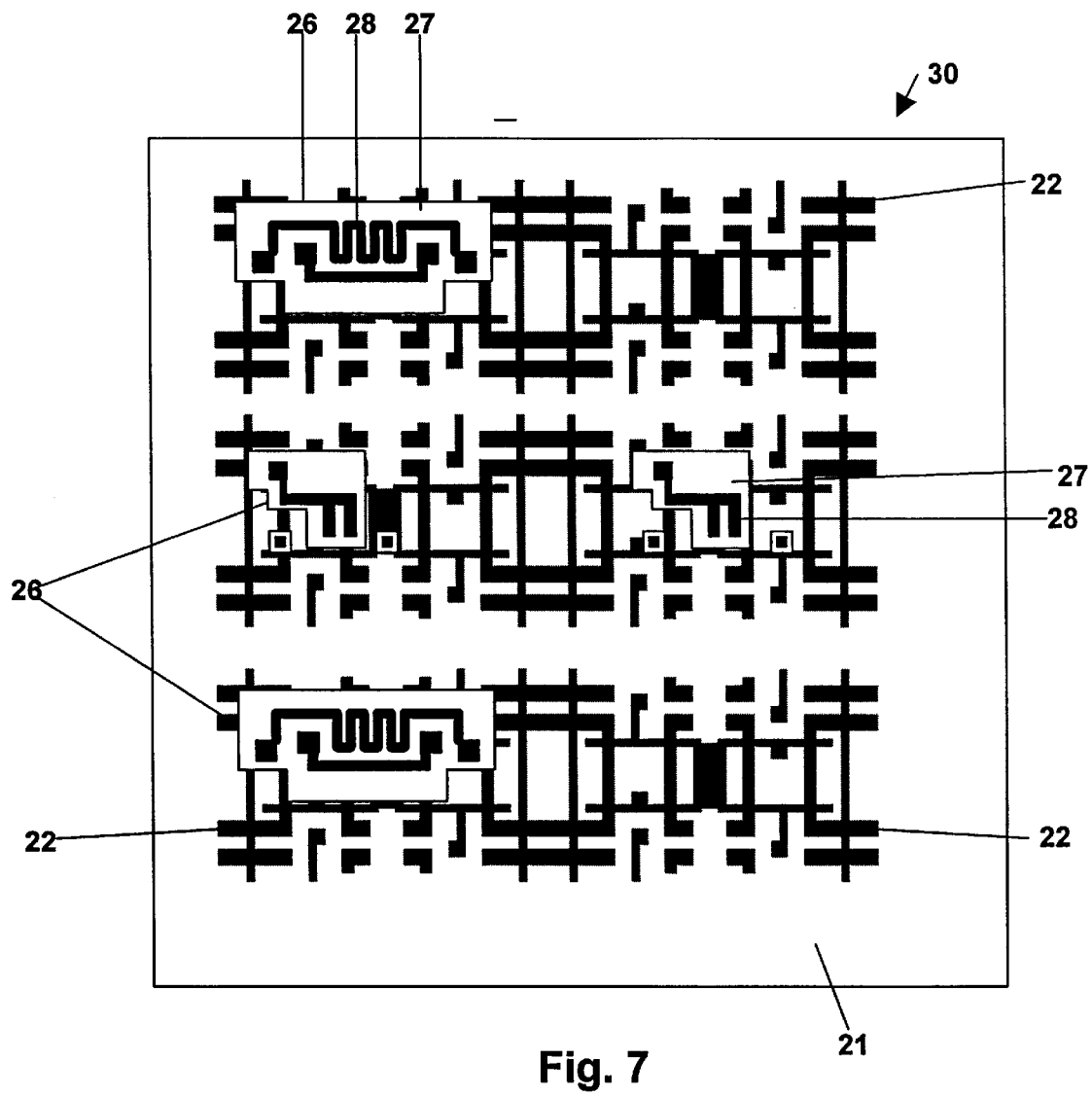
FIG. 7 illustrates a plan view of another test mask according to one aspect of the present invention.

Referring to FIG. 7, an existing product mask pattern is filled in around test substrates 26 to provide a test mask 30 according to the present invention. The existing product mask pattern contains opaque regions 21 and patterned transparent regions or openings 22. The resultant test mask 30 contains two portions; namely, a test portion represented by the test substrates 26 and a wall paper portion represented by the remaining portion of the existing product mask pattern outside of the test substrates 26. Thus, the test mask contains a test portion having at least one test pattern and a wall paper portion having an existing product mask pattern.

In both the patterned opaque regions 27, openings 28 and the patterned opaque regions 21/openings 22, the pattern density is about 20% to about 30%, the pattern variability is relatively small, pattern shapes are similar, and the preferential directions are similar (in the horizontal direction).

Materials employed to make the actual test and product masks are known. One skilled in the art could readily make such masks in view of the disclosure of the present invention. For example, the actual lithography test mask/product mask may be made of a patterned chromium layer over a fused silicon or quartz substrate.

Minimizing and/or eliminating additional engineering to a product mask due to differences in performance from a corresponding test mask provides substantial cost and time savings to the related semiconductor processes. Using existing product masks as the foundation for test masks in accordance with the present invention enables one to minimize and/or eliminate such additional engineering.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a test mask, comprising:
providing an existing product mask pattern having a first pattern;
removing a portion of the first pattern from the existing product mask pattern; and
forming a test pattern in the portion of the existing product mask pattern to provide the test mask, wherein the first pattern of the existing product mask pattern is substantially similar in at least one of pattern density, pattern variability, pattern size, pattern shape, preferential direction, and pattern scribe with the test pattern.

2. The method of claim 1, wherein the first pattern has a pattern variability that is one of random, a combination of random and predictable, and predictable, and the test pattern has a pattern variability that is the one of random, a combination of random and predictable, and predictable associated with the first pattern.

3. The method of claim 1, wherein the first pattern has an average pattern size and the test pattern has an average pattern size, and the average pattern size of the first pattern is within about 75% of the average pattern size of the test pattern.

4. The method of claim 1, wherein the first pattern has one or more pattern shapes selected from circles, squares, rectangles, lines, triangular features, L-shaped features, hexagons, and semicircles, and the test pattern has one or more of the pattern shapes of the first pattern.

5. The method of claim 1, wherein the first pattern has a pattern density and the test pattern has a pattern density, and the pattern density of the first pattern is within about 75% of the pattern density of the test pattern.

6. The method of claim 1, wherein the first pattern has one of a preferential direction in the x direction, in the y direction, and a neutral preferential direction, and the test pattern has the preferential direction of the first pattern.

7. The method of claim 1, further comprising performing a design rule check in a second portion of the first pattern adjacent the portion of the first pattern removed from the existing product mask prior to forming the test pattern.

8. The method of claim 1, wherein the test pattern and a remaining portion of the first pattern cover at least about 20% of the surface area of the test mask.

9. The method of claim 1, wherein the test mask is a lithography test mask, an etch test mask, or an implantation test mask.

10. A method of making a test mask, comprising:
forming a test pattern in a portion of a mask; and
providing an existing product mask pattern having portions removed to accommodate said test pattern and, having a first pattern in another portion of the mask to provide the test mask, wherein the first pattern of the existing product mask is substantially similar in at least one of pattern density, pattern variability, pattern size, pattern shape, preferential direction, and pattern scribe with the test pattern.

11. The method of claim 10, wherein the first pattern has a pattern variability that is one of random, a combination of random and predictable, and predictable, and the test pattern has a pattern variability that is the one of random, a combination of random and predictable, and predictable associated with the first pattern.

12. The method of claim 10, wherein the first pattern has an average pattern size and the test pattern has an average pattern size, and the average pattern size of the first pattern is within about 75% of the average pattern size of the test pattern.

13. The method of claim 10, wherein the first pattern has one or more pattern shapes selected from circles, squares, rectangles, lines, triangular features, L-shaped features, hexagons, and semicircles, and the test pattern has one or more of the pattern shapes of the first pattern.

14. The method of claim 10, wherein the first pattern has a pattern density and the test pattern has a pattern density, and the pattern density of the first pattern is within about 75% of the pattern density of the test pattern.

15. The method of claim 10, wherein the first pattern has one of a preferential direction in the x direction, in the y direction, and a neutral preferential direction, and the test pattern has the preferential direction of the first pattern.

16. A test mask, comprising:
a wall paper portion comprising a first pattern from an existing product mask pattern; and
a test portion comprising a test pattern, located in a portion removed from said wall paper portion to accommodate said test pattern, wherein the first pattern of the existing product mask pattern is substantially similar in at least one of pattern density, pattern variability, pattern size, pattern shape, preferential direction, and pattern scribe with the test pattern.

17. The test mask of claim 16, wherein the first pattern and the test pattern cover at least about 20% of the surface area of the test mask.

18. The test mask of claim 16, wherein the first pattern has a pattern density and the test pattern has a pattern density and the pattern density of the first pattern is within about 75% of the pattern density of the test pattern.

19. The test mask of claim 16, wherein the first pattern has a pattern variability that is one of random, a combination of random and predictable, and predictable, and the test pattern has a pattern variability that is the one of random, a combination of random and predictable, and predictable associated with the first pattern.

20. The test mask of claim 16, wherein the first pattern has an average pattern size and the test pattern has an average pattern size, and the average pattern size of the first pattern is within about 75% of the average pattern size of the test pattern.

21. The test mask of claim 16, wherein the test mask is one of a lithography test mask, an etch test mask, and an implantation test mask.

22. The test mask of claim 16, further comprising a design rule check portion adjacent the test portion.

23. A method of using a test mask, comprising:
providing the test mask comprising a wall paper portion comprising a first pattern from an existing product mask pattern and a test portion comprising a test pattern, located in a portion removed from said wall paper portion to accommodate said test pattern, wherein the first pattern of the existing product mask pattern is substantially similar in at least one of pattern density, pattern variability, pattern size, pattern shape, preferential direction, and pattern scribe with the test pattern;
using the test mask in a semiconductor process with a subject substrate; and
evaluating the subject substrate.

24. The method of claim 23, wherein the test portion covers from about 3% to about 70% of the surface area of the test mask.

25. The method of claim 23, wherein the first pattern has a pattern density and the test pattern has a pattern density and the pattern density of the first pattern is within about 50% of the pattern density of the test pattern.

* * * * *